United States Patent
Zheng-Yi

(10) Patent No.: US 7,400,735 B2
(45) Date of Patent: Jul. 15, 2008

(54) WAVE-FILTERING DEVICE WITH AN ADJUSTABLE FREQUENCY BANDWIDTH

(75) Inventor: Li Zheng-Yi, Taipei Hsien (TW)

(73) Assignee: Wistron Corp., Taipei Hsien (TW)

( * ) Notice: Subject to any disclaimer, the term of this patent is extended or adjusted under 35 U.S.C. 154(b) by 1173 days.

(21) Appl. No.: 10/265,442

(22) Filed: Oct. 7, 2002

(65) Prior Publication Data
US 2003/0089841 A1 May 15, 2003

(30) Foreign Application Priority Data
Oct. 24, 2001 (TW) .............................. 90126328 A

(51) Int. Cl.
*H04B 15/00* (2006.01)
(52) U.S. Cl. ................... 381/94.2; 381/94.1; 381/98; 250/214 R
(58) Field of Classification Search ............... 381/94.1, 381/94.2, 98, 94.3, 71.1, 71.11, 71.14; 700/94; 250/214 R
See application file for complete search history.

(56) References Cited

U.S. PATENT DOCUMENTS

| 4,563,651 | A | * | 1/1986 | Ohta et al. ................. 329/318 |
| 4,609,878 | A | * | 9/1986 | Rodgers ...................... 330/136 |
| 5,050,217 | A | * | 9/1991 | Orban ......................... 381/94.2 |
| 5,510,752 | A | * | 4/1996 | Gagon ......................... 330/126 |
| 5,559,340 | A | * | 9/1996 | Nakamura et al. .......... 250/551 |
| 6,055,318 | A | * | 4/2000 | Whitecar .................... 381/94.2 |

* cited by examiner

*Primary Examiner*—Vivian Chin
*Assistant Examiner*—Jason Kurr
(74) *Attorney, Agent, or Firm*—Winston Hsu

(57) ABSTRACT

The present invention relates to a wave-filtering device with an adjustable frequency bandwidth installed in an output unit of an integrated system. The wave-filtering device is used for receiving a first output signal comprising an alternating current signal and a direct current bias voltage, and comprises a direct current bias voltage detector for receiving the first output signal and obtaining a control voltage according to the direct current bias voltage. A low-pass wave filter is electrically connected to the direct current bias voltage detector and receives the control voltage so as to adjust the frequency bandwidth. The low-pass wave filter is used for receiving the first output signal and obtaining a second output signal to be the output of the wave-filtering device with adjustable frequency bandwidth. The low-pass wave filter comprises a variable resistance the value of which varies in accordance with the value of the control voltage.

8 Claims, 2 Drawing Sheets

WAVE-FILTERING DEVICE WITH AN ADJUSTABLE FREQUENCY BANDWIDTH

BACKGROUND OF THE INVENTION

1. Field of the Invention

The present invention relates a wave-filtering device, and particularly relates to a wave-filtering device automatically changing the frequency bandwidth in accordance with the different types of signals.

2. Description of the Prior Art

In the recent years, due to the advancement of technology, an integrated system has an increasingly improved function of processing video and voice data. For example, in the past, most of the processed voice data is human beings' voice signals, such as the voice on the phone. However, as the network technology advances, electrical music files, such as MP3, are prevailing. Therefore, the output unit of the integrated system has to process two kinds of signals requiring different frequency bandwidths. Some MP3 music files require high fidelity and have frequency bandwidth of 22 KHz. Nevertheless, due to the limitations of the telecommunication laws and regulations, the phone voice has a frequency bandwidth of 3 KHz.

Because noise is inevitably generated during the process of processing and transmitting the signals, the output unit of the integrated system generally has a wave filter for filtering out the unnecessary noise and keeping the voice signals remained. The frequency bandwidth of the wave filter is the criterion for determining which signals to be remained and which signals to be filtered out. However, because the difference between the frequency bandwidths of the MP3 music and phone voice is big, the output unit having only one wave filter with a fixed frequency bandwidth cannot implement the mentioned function.

In order to make the output unit successfully handle the signals with different frequency bandwidths, a digital signal processor (DSP) is provided for this purpose. The digital signal processor comprises a digital wave filter so that the DSP can obtain a digital signal within an appropriate range of frequency after transforming the signal by using Fast Fourier Transform (FFT), and then feed the obtained digital signal into a digital/analog (D/A) converter. Therefore, the D/A converter outputs a digital signal within an appropriate range of frequency. However, the DSP is expensive, and the DSP has to cooperate with software so that the spending on the software will increase. Besides, in the hardware, a memory with greater storage capacity is further required for storing the programs. In summary, using the DSP will greatly increase the cost of the integrated system without respect to hardware or software.

Besides using the DSP, another method is provided for enabling the output unit to successfully handle the signals with different frequency bandwidths. Two wave filters with different frequency bandwidths are installed in the output unit. The wave filter with smaller frequency bandwidth is used when outputting the phone voice, and the wave filter with greater frequency bandwidth is used when playing MP3 music files. However, the cost of using two wave filters is high.

SUMMARY OF THE INVENTION

Therefore, the objective of the invention is to provide a wave-filtering device automatically changing the frequency bandwidth in accordance with the different types of signals to replace the DSP so as to reduce the cost.

According to the present invention, a wave-filtering device with an adjustable frequency bandwidth is provided and is installed in an output unit of an integrated system. The wave-filtering device is used for receiving a first output signal, and the first output signal comprises an alternating current signal and a direct current bias voltage. The wave-filtering device comprises a direct current bias voltage detector for receiving the first output signal and obtaining a control voltage according the direct current bias voltage of the first output signal, and a low-pass wave filter electrically connected to the direct current bias voltage detector for receiving the control voltage so as to adjust the frequency bandwidth of the low-pass wave filter. The low-pass wave filter is used for receiving the first output signal and obtaining a second output signal from the first output signal to be the output of the wave-filtering device with adjustable frequency bandwidth. The low-pass wave filter comprises a variable resistance, and the resistance value of the variable resistance varies in accordance with the value of the control voltage.

These and other objectives of the present invention will no doubt become obvious to those of ordinary skill in the art after having read the following detailed description of the preferred embodiment, which is illustrated in the various figures and drawings.

DETAILED DESCRIPTION OF THE PREFERRED EMBODIMENT

Figure 1:
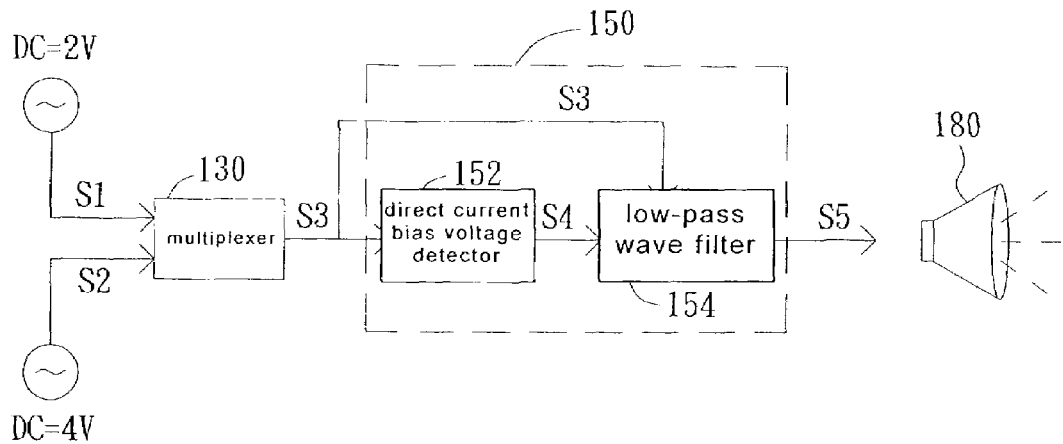
FIG. 1 is a block diagram of a wave-filtering device according to the invention.

Please refer to FIG. 1. FIG. 1 is a block diagram of a wave-filtering device according to the invention. As shown in FIG. 1, the wave-filtering device 150 has to handle two kinds of first output signals S3. One kind is voice signals S1, and the other kind is MP3 signals S2. The voice signal S1 and the MP3 signal S2 respectively comprise an alternating current signal and a direct current bias voltage. The direct current bias voltages of the voice signal and the MP3 signal can be set to be different direct current bias voltages. For example, the direct current bias voltage of the voice signal S1 is 2 Volt, and the direct current bias voltage of the MP3 signal S2 is 4 Volt. A multiplexer 130 is connected to the wave-filtering device 150 for receiving signals from different sources, such as voice signals S1 and MP3 signals S2, and outputting the first output signals S3 to the wave-filtering device 150.

The wave-filtering device 150 comprises a direct current bias voltage detector 152 and a low-pass wave filter 154. The direct current bias voltage detector 152 is used for receiving the first output signal S3 and obtaining a control voltage S4 according to the direct current bias voltage of the first output signal S3. Therefore, different control voltages S4 are generated in accordance with different direct current bias voltage. For example, if the function of the control voltage S4 generated by the direct current bias voltage detector 152 is:

Control voltage=(½)(direct current bias voltage), then the generated control voltage S4 is 1 Volt when the voice signal S1 is fed into the direct current bias voltage detector 152, and the generated control voltage S4 is 2 Volt when the MP3 signal S2 is fed into the direct current bias voltage detector 152.

As shown in FIG. 1, the low-pass wave filter 154 is connected to the direct current bias voltage detector 152, and the direct current bias voltage detector 152 feeds the control voltage S4 into the low-pass wave filter 154. The low-pass wave filter 154 is used for receiving the first output signals S3 and extracting the signals within a predetermined range of frequency from the first output signals S3 so as to output a second output signal S5 to an output device 180. For example, the output device 180 is a speaker.

The low-pass wave filter 154 is a voltage control wave filter. Namely, the frequency bandwidth of the low-pass wave filter 154 will change in accordance with the control voltage S4. Therefore, when the control voltage S4 fed into the low-pass wave filter 154 is different, the frequency bandwidth of the low-pass wave filter 154 will change. For example, the low-pass wave filter 154 can be designed to be a low-pass wave filter of which the frequency bandwidth is wider when the control voltage is greater. Thus, when the source of the first output signal S3 is MP3 signal S2, the direct current bias voltage of 4 Volt of the MP3 signal S2 will enable the direct current bias voltage detector 152 to generate a control voltage S4 of 2 Volt, and then this control voltage S4 of 2 Volt is fed into the low-pass wave filter 154 so that the frequency bandwidth of the low-pass wave filter 154 is X KHz. When the source of the first output signal S3 is a voice signal S1, the direct current bias voltage of 2 Volt of the voice signal S1 will enable the direct current bias voltage detector 152 generate a control voltage S4 of 1 Volt, and this control voltage S4 of 1 Volt is fed into the low-pass wave filter 154 so that the frequency bandwidth of the low-pass wave filter 154 is Y KHz. The greater the control voltage S4 of the low-pass wave filter 154 is, the wider the frequency bandwidth of the wave filter is. Therefore, X>Y. It can be understood that according to the different sources and different demands for the frequency bandwidths of the first output signals 130, the wave-filtering device 150 can automatically adjust the frequency bandwidth of the low-pass wave filter 154 so as to output a second output signal S5 having an appropriate frequency bandwidth.

Figure 2:
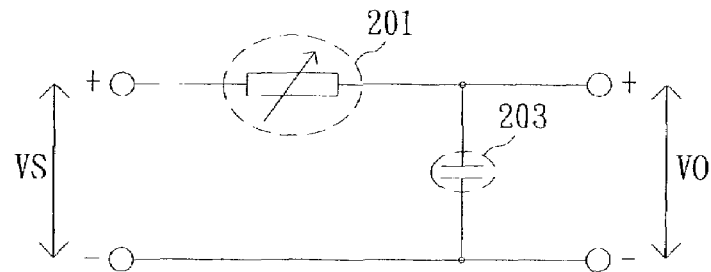
FIG. 2 is a perspective diagram of the low-pass wave filter in FIG. 1.

Please refer FIG. 2. FIG. 2 is a perspective diagram of the low-pass wave filter in FIG. 1. As shown in FIG. 2, when the low-pass wave filter 154 is a one-rank wave filter, the low-pass wave filter 154 comprises a variable resistance 201 and a capacitance 203. After the input voltage VS is inputted into the low-pass wave filter 154, the low-pass wave filter 154 will obtain an output voltage VO, and the output voltage VO is equal to the difference between the voltages at the two ends of the capacitance 203. Assume the impedance of the variable resistance 201 is R and the impedance of capacitance 203 is 1/jwC. Then, the transferring function of the wave filter is:

$H(w)=VO/VS=1/(jwCR+1)$

The cut-off frequency f is ½πRC.

It can be known that the value R of the variable resistance of the wave filter is inversely proportional to the cut-off frequency. When the value R is greater, the cut-off frequency of the wave filter is smaller. Thus, as long as the value R of the variable resistance of the wave filter is adjustable, the frequency bandwidth of the wave filter is also adjustable. In FIG. 2, the one-rank wave filter is illustrated as an example of the low-pass wave filter 154 having an adjustable frequency bandwidth, but the wave filter with an adjustable frequency bandwidth is not limited to the one-rank wave filter. The more-than-one-rank wave filter with variable resistance can be a wave filter with an adjustable frequency bandwidth.

Figure 3:
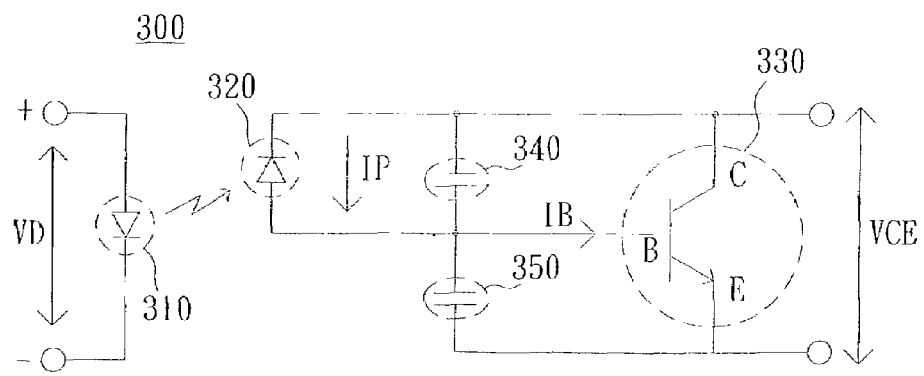
FIG. 3 is a perspective diagram of a photo-coupler as the variable resistance in FIG. 2.

Please refer to FIG. 3. FIG. 3 is a perspective diagram of a photo-coupler as the variable resistance in FIG. 2. A photo-coupler 300 is used as a variable resistance. As shown in FIG. 3, the equivalent circuit of the photo-coupler 300 comprises a light emitting diode (LED) 310, a photodiode 320 and a transistor 330. One end of the photodiode 320 is connected to the collector C of the transistor 330, and the other end of the photodiode 320 is connected to the base B of the transistor 330. The photo-coupler 300 further comprises a first capacitance 340 and a second capacitance 350. The two ends of the first capacitance 340 are separately connected to the base B and collector C of the transistor 330, and the two end of the second capacitance 350 are separately connected to the base B and emitter E of the transistor 330.

The LED 310 receives a pushing voltage VD to radiate light, and the strength of the radiated light of the LED 310 is determined based on the value of the pushing voltage VD. Consequently, the greater the pushing voltage is, the stronger the radiated light is. The photodiode 320 senses the light generated by the LED 310 and then generates a light-sensing current IP. The value of the light-sensing current IP is determined based on the strength of the light generated by the LED 310. The stronger the light is, the greater the light-sensing current IP is. As shown in FIG. 3, the base current IB of the transistor 330 is almost equal to the light-sensing current IP generated by the photodiode 320. Therefore, when the pushing voltage VD changes, the light-sensing current IP also changes so that the base current IB of the transistor 330 changes.

Figure 4:
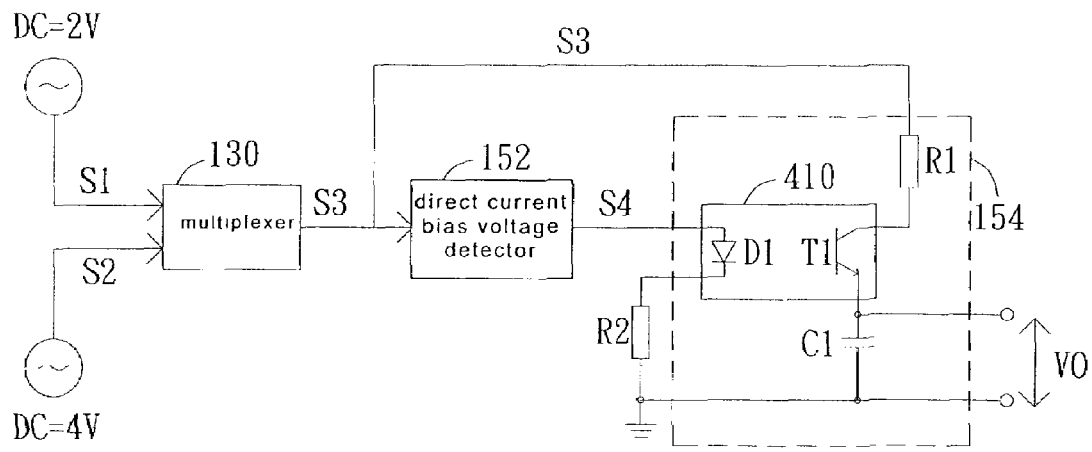
FIG. 4 is a circuit diagram of applying the low-pass wave filter of the photo-coupler of FIG. 3 to the embodiment of FIG. 1.
Figure 6:
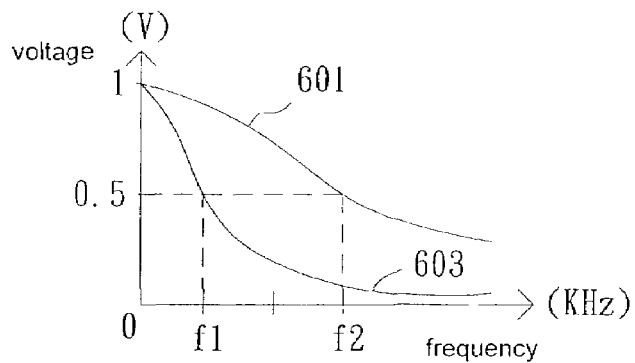
FIG. 6 shows the relationship between the frequency and the second output signal of the wave-filtering device in FIG. 1.

Please refer to FIG. 4. FIG. 4 is a circuit diagram of applying the low-pass wave filter of the photo-coupler of FIG. 3 to the embodiment of FIG. 1. The low-pass wave filter 154 comprises a photo-coupler 410, a resistance R1 and a capacitance C1. As shown in FIG. 3, the input end of the photo-coupler 410 is a LEDD1 and the output end of the photo-coupler 410 is a transistor T1. The voltage applied to the LEDD1 is a pushing voltage VD. As shown in FIG. 6, LEDD1 is connected to one end of a resistance R2, and the other end of the resistance R2 is connected to ground. The collector of the transistor T1 is connected to one end of the resistance R1, and the other end of the resistance R1 is connected to the output end of the multiplexer 130. The emitter of the transistor T1 is connected to one end of the capacitance C1, and the other end of the capacitance C1 is connected to ground. The cross voltage VO of the capacitance C1 is an output signal of the low-pass wave filter 410.

As shown in FIG. 4, the transistor cross voltage VCE of the transistor T1 is the voltage between the collector and the emitter of the transistor corresponding to the direct current bias voltage of the first output signal S3 outputted by the multiplexer 130. The value of the light-sensing current IP of the photodiode D1 is affected by the direct current bias voltage of the first output signal S3, and then affects the base current IB of the transistor T1. Therefore, when a different signal is inputted into the multiplexer 130, the base current IB of the transistor T1 will change and so will the transistor cross voltage VCE.

Figure 5:
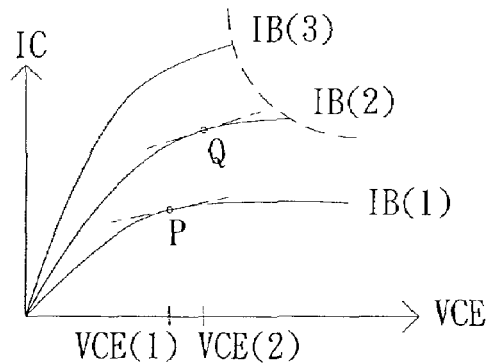
FIG. 5 is a perspective diagram of the transistor cross voltage and the collector current of the transistor in FIG. 4.

Please refer to FIG. 5. FIG. 5 is a perspective diagram of the transistor cross voltage and the collector current of the transistor in FIG. 4. As shown in FIG. 5, the vertical axis shows the collector current IC of the transistor T1, and the horizontal axis shows the transistor cross voltage VCE. The three curves in FIG. 5 represent the relationships between the transistor cross voltage VCE and the collector current IC when different base currents IB (1), IB (2) and IB (3) are inputted into the transistor 330.

Please refer to FIGS. 4 and 5. When the signal inputted into the multiplexer 130 is voice signal S1, the cross voltage VCE of the transistor T1 is VCE (1), and the base current of the transistor T1 is IB (1). When the signal inputted into the multiplexer 130 is voice signal S2, the cross voltage VCE of the transistor T1 is VCE (1), and the base current of the transistor T1 is IB (2). As shown in FIG. 5, the direct current (DC) working point is point P when the base current is IB (1) and the transistor cross voltage is VCE (1), and the DC working point is point Q when the base current is IB (2) and the transistor cross voltage is VCE (2). When the DC working point is point P, the value of the equivalent resistance between the collector C and the emitter E of the transistor 330, namely, the on-resistance of the transistor 330, is the reciprocal of the slope of the tangent line at the point P. Similarly, when the DC working point is point Q, the value of the equivalent resistance is the reciprocal of the slope of the tangent line at the point Q. As shown in FIG. 5, the resistance value at point P is greater than the resistance value at point Q.

As illustrated above, in the invention, a photo-coupler functions as a variable resistance of a low-pass wave filter so that the wave filter can automatically adjust the frequency bandwidth when receiving the signals with different direct current bias voltages.

Please refer to FIG. 6. FIG. 6 shows the relationship between the frequency and the second output signal S5 of the wave-filtering device in FIG. 1. The second output signal comprises a direct current bias voltage and an alternating current signal. As shown in FIG. 6, the vertical axis shows the voltage of the alternating current signal of the second output signal S5, and the unit is Volt (V). The horizontal axis shows the frequency of the alternating current signal, and the unit is KHz. The curve 601 represents the result when the multiplexer 130 choosing the MP3 signal S2, and the curve 603 represents the result when the multiplexer 130 choosing the voice signal S1. As shown in FIG. 6, the greatest alternating current signals of the MP3 signal and the voice signal are 1 Volt. When the voltage of the alternating current signal is decreased to 0.5 Volt, according to the curve 601, the frequency of the MP3 signal S2 is f2, and according to the curve 603, the frequency of the voice signal S1 is f1, and f2>f1.

The wave-filtering device of the invention can adjust the frequency bandwidth in accordance with different signals when processing the signals having different frequency bandwidths. Compared with the conventional device having the DSP or two wave filters with different frequency bandwidths, the invention greatly reduces the cost of the wave-filtering device.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A wave-filtering device with an adjustable frequency bandwidth installed in an output unit of an integrated system for receiving a first output signal, the first output signal comprising an alternating current signal and a direct current bias voltage, the wave-filtering device comprising:
    a direct current bias voltage detector for receiving the first output signal and obtaining a control voltage according to the direct current bias voltage of the first output signal; and
    a low-pass wave filter electrically connected to the direct current bias voltage detector for receiving the control voltage so as to adjust the frequency bandwidth of the low-pass wave filter, wherein the low-pass wave filter is used for receiving the first output signal and obtaining a second output signal from the first output signal to be an output of the wave-filtering device with an adjustable frequency bandwidth, and the low-pass wave filter comprises a variable resistance, and the resistance value of the variable resistance varies in accordance with the value of the control voltage, wherein the low-pass wave filter comprises:
        a photo-coupler comprising a light emitting diode (LED) and a transistor, the LED being used for receiving the control voltage so as to adjust the strength of the light radiated by the LED, and the on-resistance of the transistor changing in accordance with the value of the control voltage; and
        a capacitor electrically connected to the emitter of the transistor, wherein a voltage across the capacitor serves as the output of the wave-filtering device.

2. The wave-filtering device of claim 1, wherein the control voltage is a direct current voltage.

3. The wave-filtering device of claim 1, wherein the first output signal is a voice signal.

4. The wave-filtering device of claim 1, wherein the first output signal is a MP3 signal.

5. A wave-filtering device with an adjustable frequency bandwidth comprising:
    a multiplexer for receiving output signals from different sources, and the output signal comprising an alternating current signal and a direct current bias voltage;
    a direct current bias voltage detector connected to the multiplexer for receiving the output signal, and obtaining a control voltage based on the direct current bias voltage of the output signal; and
    a low-pass wave filter electrically connected to the direct current bias voltage detector for adjusting the frequency bandwidth by using the control voltage, wherein the low-pass wave filter comprises a variable resistance, the resistance value of the variable resistance changes in accordance with the value of the control voltage, wherein the low-pass wave filter comprises:
        a photo-coupler comprising a light emitting diode (LED) and a transistor, the LED being used for receiving the control voltage so as to adjust the strength of the light radiated by the LED, and the on-resistance of the transistor changing in accordance with the value of the control voltage; and
        a capacitor electrically connected to the emitter of the transistor, wherein a voltage across the capacitor serves as an output of the wave-filtering device.

6. The wave-filtering device of claim 5, wherein the control voltage is a direct current voltage.

7. The wave-filtering device of claim 5, wherein the output signal is a voice signal.

8. The wave-filtering device of claim 5, wherein the output signal is a MP3 signal.

* * * * *